(12) United States Patent
Lee et al.

(10) Patent No.: US 7,453,156 B2
(45) Date of Patent: Nov. 18, 2008

(54) WIRE BOND INTERCONNECTION

(75) Inventors: Hun-Teak Lee, Ichon-si (KR);
Jong-Kook Kim, Jungja-dong (KR);
Chul-Sik Kim, Ichon-si (KR); Ki-Youn Jang, Incheon (KR); Rajendra D. Pendse, Fremont, CA (US)

(73) Assignee: Chippac, Inc., Fremont, CA (US)

( * ) Notice: Subject to any disclaimer, the term of this patent is extended or adjusted under 35 U.S.C. 154(b) by 169 days.

(21) Appl. No.: 11/273,635

(22) Filed: Nov. 14, 2005

(65) Prior Publication Data

US 2006/0113665 A1     Jun. 1, 2006

Related U.S. Application Data

(60) Provisional application No. 60/627,650, filed on Nov. 12, 2004.

(51) Int. Cl.
*H01L 23/48* (2006.01)
*H01L 23/52* (2006.01)

(52) U.S. Cl. ............. 257/784; 257/786; 257/E23.024

(58) Field of Classification Search ............. 257/784, 257/786, E23.024; 438/617
See application file for complete search history.

(56) References Cited

U.S. PATENT DOCUMENTS

| | | | |
|---|---|---|---|
| 4,742,023 A * | 5/1988 | Hasegawa | ............. 438/614 |
| 5,328,079 A | 7/1994 | Mathew et al. | |
| 5,329,157 A | 7/1994 | Rosotker | |
| 5,340,770 A | 8/1994 | Allman et al. | |
| 5,444,303 A | 8/1995 | Greenwood et al. | |
| 5,465,899 A | 11/1995 | Quick et al. | |
| 5,561,086 A | 10/1996 | Rostoker | |
| 5,654,585 A * | 8/1997 | Nishikawa | ............. 257/666 |
| 5,686,762 A * | 11/1997 | Langley | ............. 257/775 |
| 5,904,288 A | 5/1999 | Humphrey | |
| 5,960,262 A | 9/1999 | Torres et al. | |
| 5,994,169 A | 11/1999 | Lamson et al. | |
| 6,158,647 A | 12/2000 | Chapman et al. | |
| 6,294,830 B1 * | 9/2001 | Fjelstad | ............. 257/724 |
| 6,329,278 B1 | 12/2001 | Low et al. | |
| 6,462,414 B1 * | 10/2002 | Anderson | ............. 257/738 |
| 6,541,848 B2 | 4/2003 | Kawahara et al. | |
| 6,561,411 B2 | 5/2003 | Lee | |
| 6,624,059 B2 | 9/2003 | Ball | |
| 6,713,881 B2 | 3/2004 | Umehara et al. | |

(Continued)

OTHER PUBLICATIONS

International Search Report and Written Opinion for corresponding International Application No. PCT/US05/41116 dated May 07, 2007.

*Primary Examiner*—Nitin Parekh

(57) ABSTRACT

A wire bond interconnection between a die pad and a bond finger includes a support pedestal at a bond site of the lead finger, a ball bond on the die pad, and a stitch bond on the support pedestal, in which a width of the lead finger at the bond site is less than a diameter of the support pedestal. Also, a semiconductor package including a die mounted onto and electrically connected by a plurality of wire bonds to a substrate, in which each of the wire bonds includes a wire ball bonded to a pad on the die and stitch bonded to a support pedestal on a bond site on a lead finger, and in which the width of the lead finger at the bond site is less than the diameter of the support pedestal.

22 Claims, 5 Drawing Sheets

U.S. PATENT DOCUMENTS

| | | |
|---|---|---|
| 6,787,926 B2 * | 9/2004 | Chen et al. .................. 257/784 |
| 6,849,931 B2 | 2/2005 | Nakae |
| 2003/0089521 A1 | 5/2003 | Lee et al. |
| 2004/0152292 A1 * | 8/2004 | Babinetz et al. ............. 438/617 |
| 2005/0133928 A1 * | 6/2005 | Howard et al. ............. 257/773 |
| 2006/0049523 A1 | 3/2006 | Lin |
| 2006/0102694 A1 | 5/2006 | Lee et al. |

* cited by examiner

WIRE BOND INTERCONNECTION

CROSS-REFERENCE TO RELATED APPLICATIONS

This application claims the benefit of U.S. Provisional Application No. 60/627,650, filed Nov. 12, 2004, tiled "Ball-contact integrated circuit system", which is hereby incorporated by reference.

BACKGROUND

This invention relates to semiconductor packaging and, particularly, to wire bond interconnection.

Wire bonding provides a widely accepted means for interconnecting a semiconductor device with the circuitry in which the device is used. Particularly, for example, wire bonds are used to make connections between pads at the active surface of the die and bond sites on a lead frame or on lead fingers on a substrate.

Developments in semiconductor processing have provided increasing numbers and densities of elements in the semiconductor die, and, accordingly, higher numbers of smaller and more closely arranged pads for interconnection of the die with the environment in which it used. A typical die pad pitch may be, for example, about 45-50 µm.

In practice, owing in part to process limitations, the densities of lead fingers on a typical substrate are significantly greater, and the lead finger pitch in a conventional substrate may typically be about three times greater than the die pad pitch. As a result, the wires must "fan out" from the die pads to bonds sites on the lead fingers.

The circuitry in the metal layer on a substrate, including traces and bond fingers, is ordinarily formed by masking, patterning and etching a metal layer (such as copper, for example) on the substrate dielectric. Usually the patterned etch results in traces having generally trapezoidal cross-sections, so that the "flat" or "pad" on which the stitch bond is formed on the bond fingers, for example, is narrower than the base, next to the substrate. Typically the flat on a conventional lead finger is significantly wider than the stitch bond that is to be formed upon it, and the flat on a conventional lead finger may be about 2-3 times as wide as the wire diameter. A typical flat width may be about 40 µm, for example, and because the cross-section of the lead finger is typically trapezoidal (the flat being narrower than the base), the width of the lead finger at the substrate dielectric that carries it is somewhat greater. Moreover, usually, where the circuitry is copper, for example, the patterned bond fingers are plated with nickel (to a thickness about 5-10 µm) and gold (to a thickness about 0.5 µm), adding further to the overall width of the bond fingers. Plating debris may be left on the dielectric adjacent the plated lead fingers, requiring additional separation between adjacent lead fingers, to avoid electrical shorts. Owing to these and other various processing limitations, the design distance between adjacent traces or bond fingers cannot be reduced below a practical limit, which may typically be about 45 µm.

As a result of these requirements and limitations, in a conventional substrate having plated copper traces the lead finger pitch may be about 130 µm, for example. Where the die pad pitch is about 50 µm, for example, the wire bonds from a row of pads along one edge of the die must fan out to a row of lead fingers that may be nearly three times as wide as the row of die pads. This requires that the substrate be much larger than the die, and that the wires be very long. Greater substrate size and longer wires results in greater materials and processing costs. Moreover, where radio frequency ("rf") signals are to be carried between the die and the substrate, longer wires are undesirable because long wires carrying rf signals can cause electromagnetic interference with nearby wires or circuitry.

It is desirable, therefore, to reduce the bond finger pitch as much as is practicable.

SUMMARY

In one general aspect the invention features a wire bond interconnection between a die pad and a bond finger, comprising a support pedestal at a bond site of the lead finger, a ball bond on the die pad, and a stitch bond on the support pedestal. The lead finger is narrow at the bond site, so that in some embodiments the flat of the lead finger at the bond site is narrower than the diameter of the support pedestal; and in other embodiments the flat of the lead finger at the bond site is so narrow that it has the form of an apex rather than a flat.

The lead finger at the bond site has a base surface at the substrate dielectric, and a plateau or flat or apex oriented away from the substrate dielectric. A cross section of the lead finger at the bond site may have a generally trapezoidal appearance, with slanted sides between the base and the plateau, and the plateau may be flat or rounded; or it may have a generally triangular appearance truncated at the apex, with slanted sides between the base and the truncation, and the truncation may be flat or rounded; or it may have a generally triangular appearance with slanted sides meeting at a sharp or rounded apex. That is, in embodiments in which the lead finger at the bond site is relatively wider than high, the cross sectional shape is generally trapezoidal, and may have a more or less rounded plateau; and in other embodiments in which the lead finger at the bond site is relatively narrower than high, the cross sectional shape may be more nearly triangular, and may have a more or less rounded apex.

In some embodiments the plateau at the bond site of the lead finger has a width less than about 40 µm; that is, the plateau has a width in a range from substantially zero (forming an apex) to about 40 µm. The support pedestal has the effect of widening the landing area for the stitch bond that is subsequently formed upon it, reducing bond failures that could otherwise result from misalignment of the stitch bonds on the narrow bond sites.

In some embodiments the support pedestal is deformed over the plateau or apex so that it conforms to at least an upper part of at least one of the slanted sides. In some such embodiments the support pedestal conforms to the full height of at least one of the slanted sides, so that a part of the pedestal contacts the substrate dielectric alongside the lead finger.

The lead finger is formed as a patterned metal layer on the substrate. The metal layer may comprise copper or another conductive metal, and where the lead finger comprises copper, it may be plated at the bond site with, for example, a film of nickel over the copper and a film of gold over the nickel film.

In another aspect the invention features a semiconductor package including a die mounted onto and electrically connected by a plurality of wire bonds to a substrate, in which each of the wire bonds includes a wire ball bonded to a pad on the die and stitch bonded to a support pedestal on a bond site on a lead finger, and in which the width of the lead finger at the bond site is less than the diameter of the support pedestal.

In some embodiments the lead finger bond pitch is less than about 100 µm, or less than about 95 µm, or less than about 90 µm; in some embodiments the lead finger bond pitch is in a range from about 80 μm to about 100 μm. In some embodiments the lead finger bond pitch is about the same as the die pad pitch.

In some embodiments the package substrate comprises a two-tier substrate, each tier including a plurality of lead fingers having a lead finger bond pitch about twice the die pad pitch, the lead fingers of the first tier and the second tier having a staggered arrangement so that the effective lead finger pitch of the two-tier substrate is about the same as the die pad pitch.

In some embodiments the support pedestal is formed using a wire bonding tool as in formation of a stud bump, and in such embodiments the support pedestal is metallurgically bonded to the lead finger. Where the support pedestal is gold formed in a stud bumping operation, and the lead finger is copper, for example, the bond site on the lead finger need not be plated, and the support pedestal may be formed directly on the lead finger.

In another aspect the invention features a semiconductor package including a die affixed to a substrate, in which the die is electrically connected to the substrate by wire bonds each having a ball bond formed on a die pad and a stitch bond formed on a support pedestal mounted at a bond site on a lead finger on the substrate. The width of the lead finger at the bond site is less than the diameter of the support pedestal.

In another aspect the invention features a method for forming a wire bond interconnection between a semiconductor die and a substrate, by steps of providing a die affixed on a die mount portion of a first side of a substrate and oriented with the active side away from the substrate, the substrate having patterned traces including lead fingers in the first side of the substrate; forming a support pedestal on a bond site of a lead finger; forming a first bond on a die pad; and forming a second bond on the support pedestal. The first bond is a ball bond and the second bond is a stitch bond.

Decreasing the lead finger bond pitch (increasing the bond density on the substrate) provides for a substrate having a smaller area, and shorter wires. This results in reduced costs for materials and processing. Additionally, where the wires carry radio frequency signals, shorter wires are desirable for minimizing electromagnetic interference, and can enable the use of wire bond interconnection in high performance rf devices.

Particularly, where the lead finger bond pitch is about the same as the die pad pitch, the wire bond interconnects can be orthogonal, that is, the wires need not fan out from the pads to the lead fingers, and the wire bonds can accordingly be made as short as is practicable using available wire binding equipment.

The package according to the invention can be used for building computers, telecommunications equipment, and consumer and industrial electronics devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
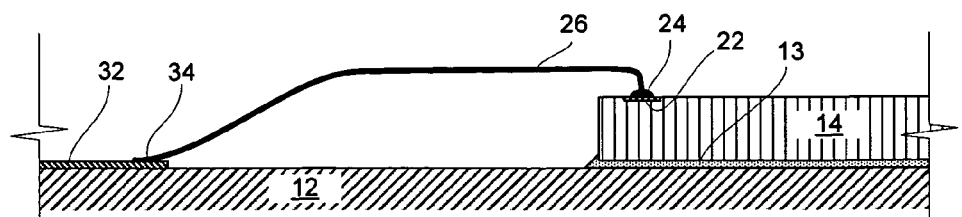
FIG. 1 is a diagrammatic sketch in an elevational view showing a semiconductor die affixed to a substrate, having conventional forward wire bond interconnection between the die and the substrate.

Turning now to FIG. 1, there is shown a conventional wire bond interconnect. A semiconductor die 14 is mounted active side upward upon a die attach surface of a substrate 12 and affixed there using a die attach adhesive 13. The active side of the die 14 is provided with interconnect pads 22; other features of the die are not shown in the FIGS. The substrate includes at least one layer of a dielectric material and at least one patterned metal layer. A metal layer in the die attach side of the substrate 12 is patterned to provide appropriate circuit traces, including bond fingers 32. The die 14 is electrically interconnected with the circuitry on the substrate by wires 26 formed between the die pads 24 and the bond fingers 32.

Wire bonding processes are well known. The following outline of an illustrative conventional wire bonding process is offered by way of example only. The wire bond is formed using machinery including a capillary bonding tool, a support for the device to be wire bonded, a source of heat, a source and transducer to impart ultrasound vibration to the capillary bonding tool, and means—typically at least partially automated, and at least partially under programmable computer control—for coordinating the movement of these machinery elements and the implementation of their functions. A wire, typically of aluminum or gold, is carried in the lumen of the capillary, and the machinery includes means for controlling the movement of the wire through the tip of the capillary. To form a wire bond as shown for example in FIG. 1, the die is affixed to the substrate, and then the die and substrate are mounted on the support stage. The support is provided with a heater that controllably heats the substrate and die. The capillary is poised over the die and substrate, and a wire is fed through the capillary lumen so that it projects to a selected extent from the capillary tip. The first bond is formed as follows: An electric arc is struck to form a molten ball at the projecting end of the wire. The capillary moved over the die and substrate so that the tip is aligned in the x-y plane over the first target bonding site (the die pad in this example). Tension is drawn on the wire to pull the ball back into a chamfer in the capillary tip as the capillary is lowered to bring the ball into contact with the first target bonding site. The capillary is moved in the z direction to press the ball against the bonding site, and the transducer is activated to impart an ultrasonic vibration to the capillary. The capillary tip (particularly, the chamfer, which grips the ball at this phase) imparts a vibration to the ball as it is compressed against the target. A metallurgic bond is formed between the ball and the target, completing first bond (the "ball" bond). Then the wire "loop" is formed as follows: the wire is fed through the capillary is the capillary is raised away from the first target, and then moved in a controlled path in relation to the die and substrate (to control the eventual shape of the completed wire bond) toward a position where it is aligned in the x-y plane over the second target bonding site (a pad or bond finger on a trace on the substrate in this example). Then the second bond is formed as follows: The capillary is lowered to press the wire against the second target bonding site, and again the transducer is activated to impart a vibration to the wire as it is squashed against the target, forming a metallurgic bond between the wire and the target. Then the capillary is moved along the bond site, and is then raised, forming a "tail" of wire projecting from the capillary tip. Finally, the wire is gripped as the capillary is raised further, causing the wire to break near the second bond and leaving the "tail" of wire projecting from the capillary tip, ready for formation of a subsequent ball by electric arc at the wire end.

Figure 2A:
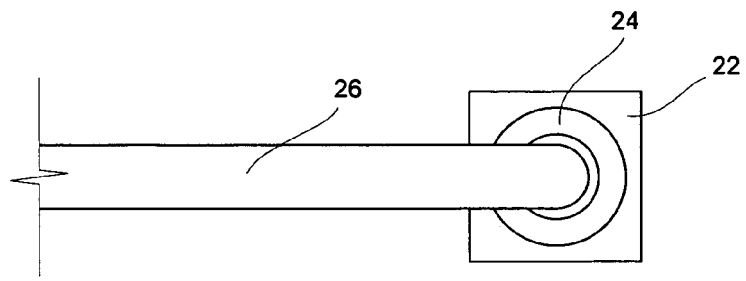
FIG. 2A is a diagrammatic sketch in a plan view of a portion of a conventional forward wire bond interconnection as in FIG. 1, showing a conventional first bond of the wire to a pad on the die.
Figure 2B:
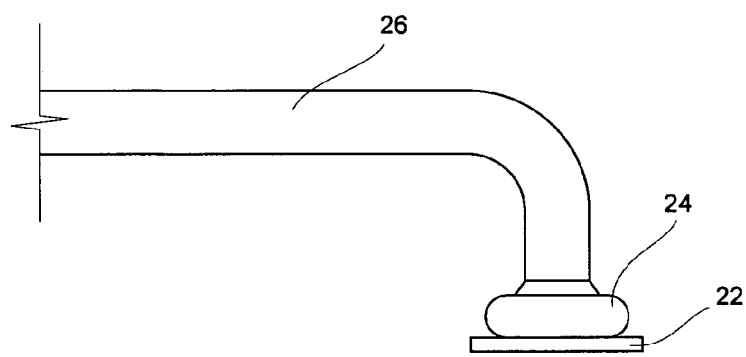
FIG. 2B is a diagrammatic sketch showing a conventional first bond as in FIG. 2A, in an elevational view.
Figure 3A:
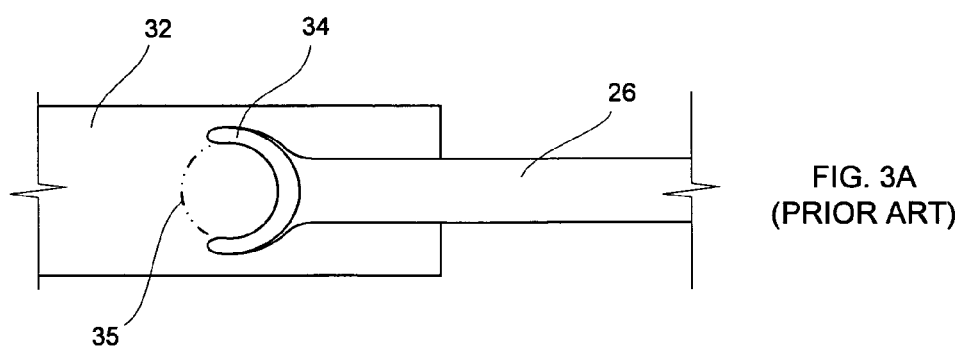
FIG. 3A is a diagrammatic sketch in a plan view of a portion of a conventional forward wire bond interconnection as in FIG. 1, showing a conventional second bond of the wire to a bond finger on the substrate.
Figure 3B:
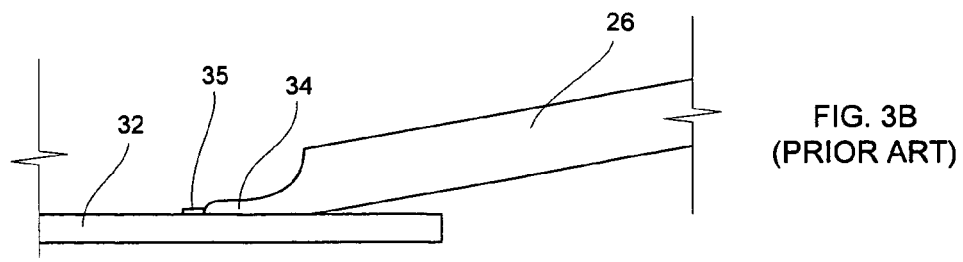
FIG. 3B is a diagrammatic sketch showing a conventional second bond as in FIG. 3A, in an elevational view.

The appearance of an illustrative first ("ball") bond is shown diagrammatically in two views at FIGS. 2A and 2B, and the appearance of an illustrative second ("stitch") bond is shown diagrammatically in two views at FIGS. 3A and 3B. The completed ball bond includes a compressed ball 24 metallurgically bonded to the die pad 22. The completed stitch bond includes a squashed wire end 34 metallurgically bonded to a "flat" or "pad" on the bond finger 32. A residue of the wire can remain in place on the pad, as indicated at 35. As will be appreciated, some variation in the shapes of the first and second bonds will be expected, depending on other things upon the shape and dimensions of the capillary tip (particularly the chamfer) and upon various other process parameters. Particularly, some variation in the appearance of the second bond may result from the use of given machinery and processing parameters, owing to the fact that the wire is broken to complete the bond.

As is shown particularly in FIG. 3A, the bond finger or bond pad typically has at the bond site a generally flat "landing" surface, sometimes termed a "flat", on which the bond is formed, which is significantly wider than the completed stitch bond formed upon it, as discussed above.

The process described above is often referred to as a "forward" wire bonding process, by contrast with a "reverse" wire bonding process. In a reverse wire bonding process, the first ("ball") bond is formed on the lead finger flat or pad, and the second ("stitch") bond is formed on the die pad. It may be advisable where a reverse wire bonding process connects a substrate with a die, to raise the second end of the wire, near the second bond, to avoid contact of the wire with the active surface of the die. Accordingly in a reverse wire bonding process a ball may be formed on the die pad, upon which the second ("stitch") bond is formed. Such a procedure is shown, for example, in Lee U.S. Pat. No. 6,561,411.

Figure 4:
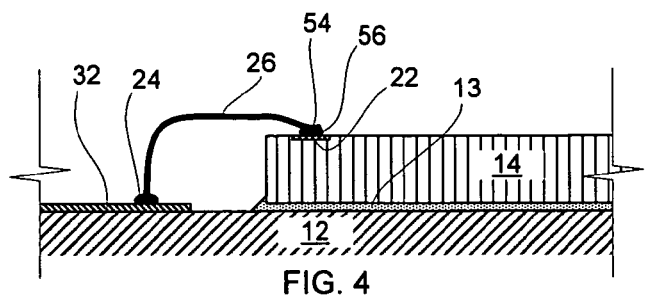
FIG. 4 is a diagrammatic sketch in an elevational view showing a semiconductor die affixed to a substrate, having conventional reverse wire bond interconnection between the die and the substrate.

An illustrative example of such a reverse wire bond interconnect is shown by way of example in FIG. 4. As in the forward wire bond example of FIG. 1, a semiconductor die 14 is mounted active side upward upon a die attach surface of a substrate 12 and affixed there using a die attach adhesive 13. The active side of the die 14 is provided with interconnect pads 22; other features of the die are not shown in the FIGS. The substrate includes at least one layer of a dielectric material and at least one patterned metal layer. A metal layer in the die attach side of the substrate 12 is patterned to provide appropriate circuit traces, including bond fingers 32. The die 14 is electrically interconnected with the circuitry on the substrate by wires 26 formed between the die pads 24 and the bond fingers 32. In the reverse wire bond configuration, the first ("ball") bond 24 is formed on a "flat" or "pad" of the bond finger 32 and the second ("stitch") bond 54 is formed on a pedestal 56 formed as a ball previously deposited on the die pad 22.

Figure 5:
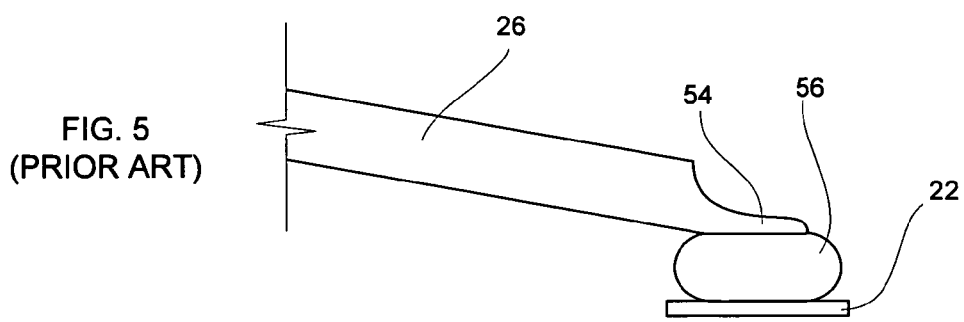
FIG. 5 is a diagrammatic sketch in an elevational view showing a conventional second bond of the wire on a ball on the die pad.
Figure 6A:
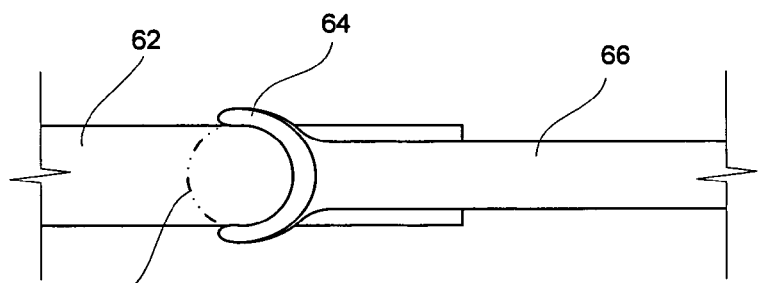
FIG. 6A is a diagrammatic sketch in a plan view of a portion of a conventional forward wire bond interconnection as in FIG. 1, showing a properly aligned second bond of the wire to a narrow bond finger on the substrate.
Figure 6B:
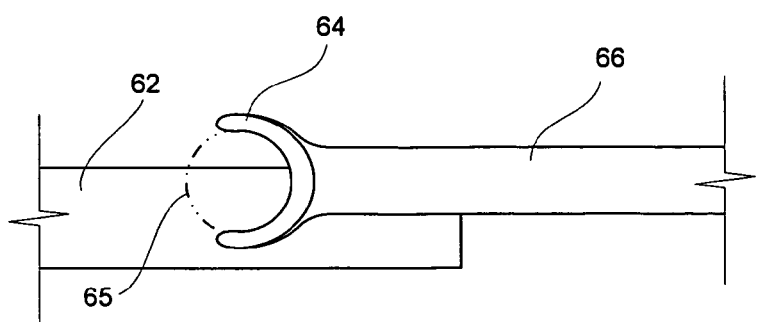
FIG. 6B is a diagrammatic sketch in a plan view of a portion of a conventional forward wire bond interconnection as in FIG. 1, showing a misaligned second bond of the wire to a narrow bond finger on the substrate.

A diagrammatic illustration of a second ("stitch") bond 54 on a ball 56 on a die pad 22 is illustrated by way of example in FIG. 5.

Where forward wire bonding is employed, it might be possible in principle to make the pitch of the interconnections on the substrate smaller by reducing the width of the bonding sites. This has not been generally accepted at least because of uncertainty in the patterning process, and of uncertainty in the wire bonding process in alignment of the stitch bond on a resulting narrower bond finger; and of resulting poor consistency or reliability or robustness in the resulting second bonds. Proper alignment and consequences of misalignment of a stitch bond with a narrower bond finger are illustrated in FIGS. 6A and 6B. Here the bond finger is narrower than the stitch bond (as may be compared to the diameter of the compressed ball in a ball bond made using the same capillary).

Where the alignment is sufficiently precise, as illustrated in an ideal case for example in FIG. 6A, the stitch bond may be acceptably robust. Here there may be a sufficiently good metallurgic bond between the portion 64 of the second wire end 66 and the narrow bond finger 62, although this may depend upon the extent to which the flattened remnant of the flattened wire outlined by broken line 65, whose form may be unreliable, may aid in providing a good conductive interconnection.

Where the alignment is less than perfect, as illustrated diagrammatically for example in FIG. 6B, the second bonding process can fail to make a good connection with the bond finger 62. It is uncertain what the configuration of the resulting portion 66 of the wire end 66 and of the residue 65 of the second bonding process may be, but, in any event, a consistently or reliable or robust bond cannot be suitably assured. Accordingly, trying to reduce lead finger pitch by narrowing the flat width on the lead finger is generally not acceptable.

According to the invention, the bond finger is narrow at the second bond site, a pedestal is formed on the narrow bond site, and the second ("stitch") bond is formed on the pedestal. The pedestal can be formed as a ball, for example, in the manner of forming a stud bump. That is, wire bonding apparatus is employed to form a ball on the narrow bond finger as if forming a first ("ball") bond interconnection, but then, instead of drawing the wire to form a loop, the wire is clamped as the capillary is moved upward, so that the wire breaks off just above the ball, leaving a "tail". The top of the ball, including the wire tail, may be flattened, for example by "coining", to form a generally flattened surface before the second ("stitch") bond is formed on it. The stitch bond is formed generally as described above with reference to FIGS. 3A, 3B, except that here the stitch bond is formed upon the (usually flattened) surface of the pedestal 72 rather than on the flat landing surface of the bond finger 32. According to the invention, the completed stitch bond includes a squashed wire end 74 metallurgically bonded to the pedestal 72, and a residue of the wire can remain in place on the pad, as indicated at 75. Some variation in the shapes of the first and second bonds will be expected, depending on other things upon the shape and dimensions of the capillary tip (particularly the chamfer) and upon various other process parameters. Particularly, some variation in the appearance of the second bond may result from the use of given machinery and processing parameters, owing to the fact that the wire is broken to complete the bond.

Figure 7A:
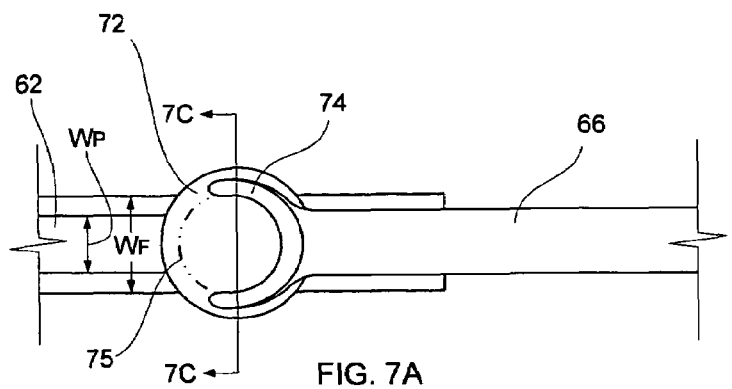
FIG. 7A is a diagrammatic sketch in a plan view of a portion of a forward wire bond interconnection to a narrow bond finger according to an embodiment of the invention, showing a second bond of the wire to a pedestal on a narrow bond finger on the substrate.
Figure 7B:
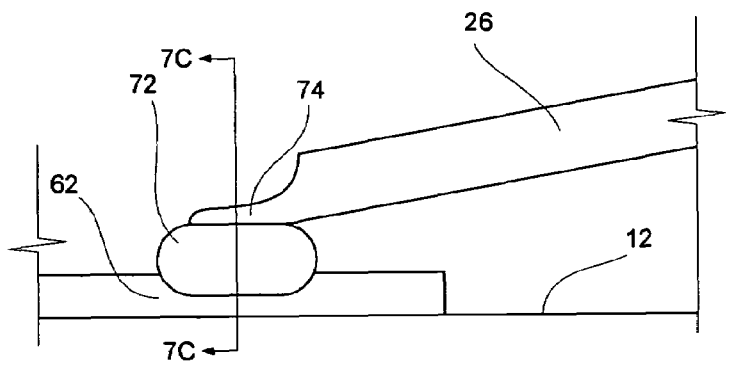
FIG. 7B is a diagrammatic sketch showing the second bond according to an embodiment of the invention as in FIG. 7A, in an elevational view.
Figure 7C:
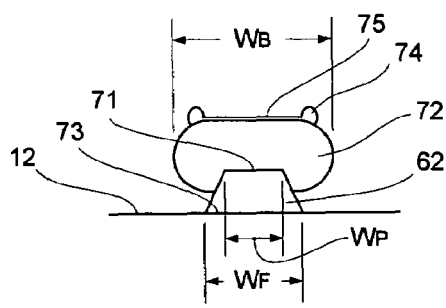
FIG. 7C is a diagrammatic sketch showing the second bond as in FIGS. 7A, 7B in a sectional view at 7C-7C.
Figure 7D:
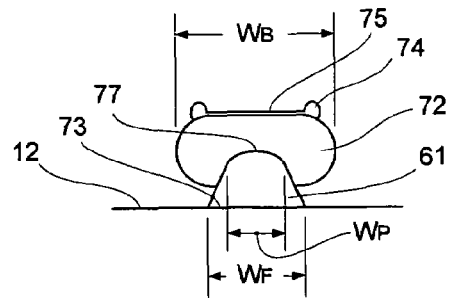
FIGS. 7D, 7E are diagrammatic sketches in sectional views generally as in FIG. 7C, showing various narrow bond finger configurations.
Figure 7E:
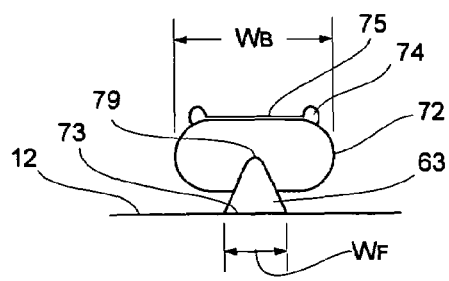
Figure 8:
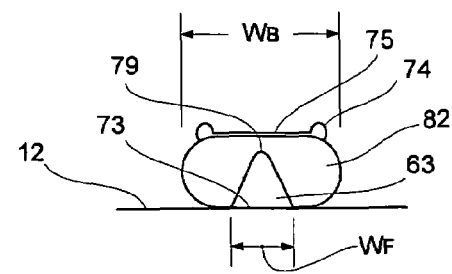
FIG. 8 is a diagrammatic sketch showing the second bond according to an embodiment of the invention, in a sectional view.

A resulting second bond according to the invention is shown by way of example in FIGS. 7A, 7B. A narrow bond site 62 on a lead finger has a generally trapezoidal, or roughly triangular (truncated), or roughly triangular (with a rounded apex) cross section (refer to FIGS. 7C-7E). Where the bond site part 62 of the lead finger has a generally trapezoidal cross section, with a roughly flat top, the width WP of the flat top 71 of the bond finger at the bond site is less than the width (roughly, the diameter) WB of the support pedestal 72. Usually, the width WF of the base 73 of the bond finger at the bond site, which is somewhat larger than the width WP of the flat top 71, is also less than the width (diameter) WB of the support pedestal 72. Typically, the top 71 of the bond site part of the bond finger is not perfectly flat and the edges of it are not as sharply defined as appears in the FIGS. As is illustrated in FIG. 7D, the top 77 of the bond site part of the bond finger may be rounded. According to the invention, as noted above, the top of the bond site part of the bond finger is narrower than the pedestal diameter, and the process of forming the support pedestal 72 on the bond site part of the bond finger causes the ball to deform around the lead finder at the bond site. Thus according to the invention, the bond finger may be made proportionately much narrower than the pedestal diameter WB and, as illustrated in FIG. 7E, the bond finger at the bond site may be narrowed so that the cross sectional shape is nearly triangular, as illustrated for example in FIG. 7E, with an apex 79, which has no flat but may be rounded. As the sectional views in FIGS. 7C-7E show, whether the lead finger at the bond site has a generally flat (FIG. 7A) or rounded (FIG. 7B) plateau, or has sharp or rounded apex (FIG. 7C), the support pedestal 72 conforms to the shape of the plateau or apex; that is, as the support pedestal is formed, it conforms to at least the upper part of at least one of the sides of the lead finger. In the examples shown in the FIGS., the support pedestal was precisely aligned with the bond site during its formation, so that it is symmetrically disposed upon the lead finger and, accordingly, parts of the pedestal have been equally deformed one the two sides of the lead finger. It is not necessary that the support pedestal be perfectly aligned, and in practice the deformation may be asymmetrical to some extent. Moreover, as illustrated for example in FIG. 8, where the lead finger is sufficiently thin in the z direction, parts of the support pedestal 82 may touch the surface of the substrate 12 alongside the base of the lead finger 63. We have found that robust electrical connection can be formed between a ball and a comparatively narrow bond site part of the lead finger, and that a second ("stitch") bond 75 can be reliably formed upon a support pedestal 72, 82 so formed, as illustrated in FIGS. 7C-7E and 8.

In as much as the wire length (and substrate area) depends upon the lead finger bond pitch, reduction of the bond pitch according to the invention can result in significant shortening of wire lengths and reduction of substrate area.

As may be appreciated, the feature width may vary among the various leads and lead fingers on the substrate, and may vary along the length of a given lead or lead finger according to the invention, the lead finger (at least the plateau of the lead finger) is less than the support pedestal diameter at the bond site, that is, at the place along the length of the lead where the support pedestal is formed; the trace may be narrower or wider at other points, so long as the desired lead finger density (and lead finger bond pitch) is obtained.

Figure 9A:
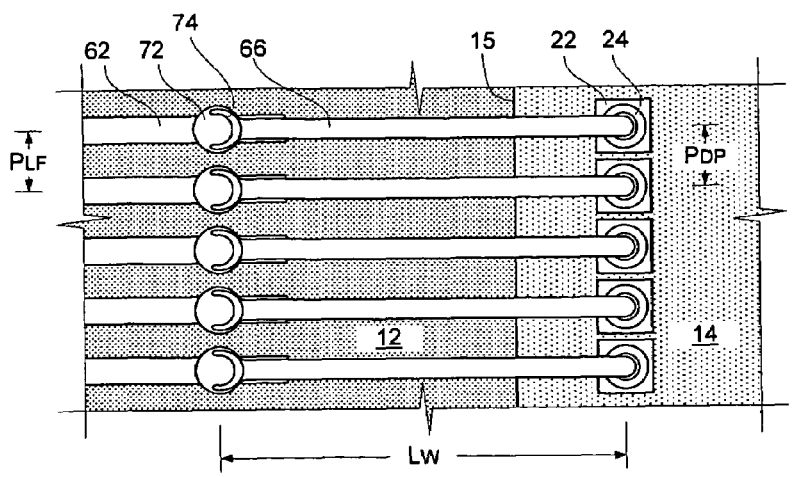
FIGS. 9A, 9B are diagrammatic sketches in plan view each showing high density interconnection of a portion of a die to a portion of a substrate according to an embodiment of the invention.
Figure 9B:
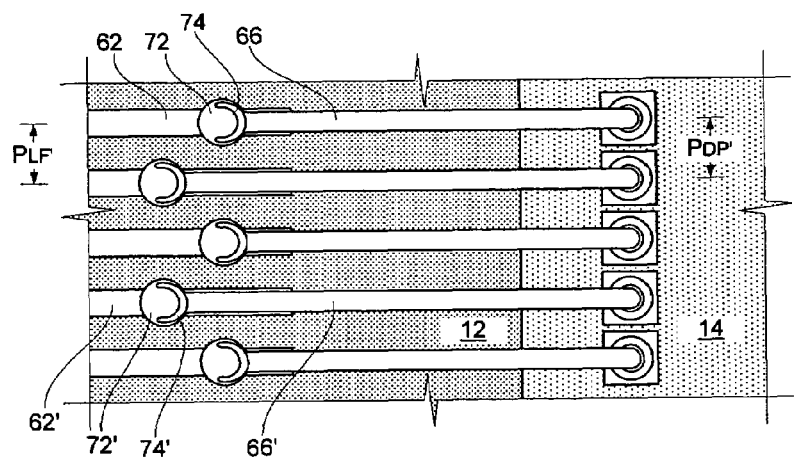

FIGS. 9A and 9B show in plan view two lead finger arrangements according to the invention in which the die pad pitch PDP is the same as the lead finger bond pitch PLF, so that the wires run parallel, rather than fanning out, as they must where the lead finger bond pitch is greater than the die pad pitch. Such an arrangement is sometimes termed "orthogonal", and it provides for minimal wire length and substrate area. Die pads 22 are arrayed in a row along an edge 15 of the die 14. Lead fingers 62, narrowed at the bond sites, are arranged in the die attach surface of the substrate 12 in a row, with the bond fingers generally aligned with the corresponding die pads. A support pedestal (72 in FIG. 9A, 72 and 72' in FIG. 9B) is formed at the lead finger bond site on each lead finger; in FIG. 7A the support pedestals are arranged in a single line, while in FIG. 7B they are arranged in two staggered rows. The arrangement of FIG. 7B provides a greater distance between nearest support pedestals while maintaining the same pitch (die pad pitch PDP'; lead finger bond pitch PLF'). Referring to FIGS. 7A, 7B, wire bonds are formed between the die pads and the respective bond fingers, by forming a first ("ball") bond 24 on the die pad 22, drawing the wire 66 (66') to the respective lead finger 62 (62') bond site, and forming a second ("stitch") bond 74 (74') on the support pedestal 72 (72'), as described for example with reference to FIGS. 7A-7E and 8.

Figure 10A:
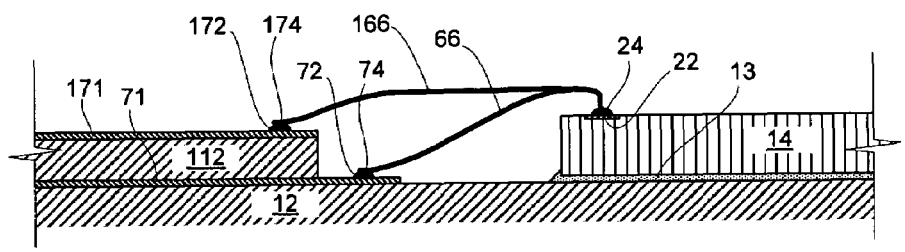
FIGS. 10A, 10B are diagrammatic sketches in a sectional view and in a plain view showing high density interconnection of a portion of a die to a portion of a tiered substrate according to an embodiment of the invention.
Figure 10B:
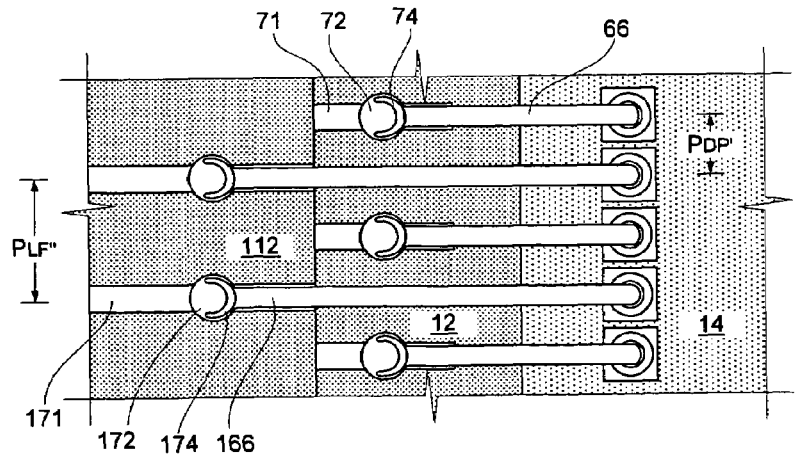

In practice, even where the lead finger width at the bond site is minimized according to the invention (see for example FIGS. (7E, 8), practical (processing technology) limitations constrain the extent to which the separation between adjacent lead fingers can be minimized. Using standard processing, a separation of about 40 μm may be a practical minimum, for example. Where the die pad pitch is very fine, such as 50 μm or less, it may not be possible to obtain orthogonal wire bonding in an arrangement such as is shown for example in FIGS. 9A or 9B. To obtain orthogonal wire bonding where the die pad pitch is very fine, the invention can be employed using a tiered (such as a two-tiered) substrate, as is illustrated for example in FIGS. 10A and 10B. Here, as in FIGS. 9A, 9B, die pads are arranged in a row along an edge of the die 14. Lead fingers having narrow bond sites 162 are arranged in the die attach surface of a first (lower) substrate 12 in a first row, with the lead fingers generally aligned with corresponding alternating ones ($1^{st}$, $3^{rd}$, $5^{th}$, etc.) of the die pads; and lead fingers having narrow bond sites 162' are arranged in a surface of a second (upper) substrate 112 in a second row, with the lead fingers generally aligned with alternating ones ($2^{nd}$, $4^{th}$, $6^{th}$, etc.) of the die pads not corresponding lead fingers in the first substrate. The edge of the upper substrate is set back so that the bond sites on the lead fingers on the lower substrate are exposed.

A first row of support pedestals 72 are formed at the exposed lead finger bond sites of the lead fingers 71 on the lower substrate 12, and a second row of support pedestals 172 are formed at the lead finger bond sites of the lead fingers 171 on the upper substrate 112. Wire bonds are formed between the die pads 22 and the respective bond fingers, alternately 71, 171, by forming a first ("ball") bond 24 on the die pad 22, drawing the wire 66, 166 to the respective lead finger 71, 171 bond site, and forming a second ("stitch") bond 74, 174 on the support pedestal 72, 172, as described for example with reference to FIGS. 7A-7E and 8. In this example, the lead finger bond pitch PLF''' in both the lower and the upper rows of lead fingers is twice as great as the die pad pitch PDP'. According to the invention, a fine lead finger bond pitch (for example, in a range between about 80 µm and about 100 µm can be obtained in each of the rows of lead fingers, and because the lead fingers in the two rows are staggered, the combined effective lead finger bond pitch is half as great as in each row (that is, in the example given above, between about 40 µm and about 50 µm). This can provide for orthogonal wire bond interconnection of a die having a pad pitch in a range as small as about 40 µm and about 50 µm, and wire lengths as short as 1 mm or shorter can be possible.

Figure 11A:
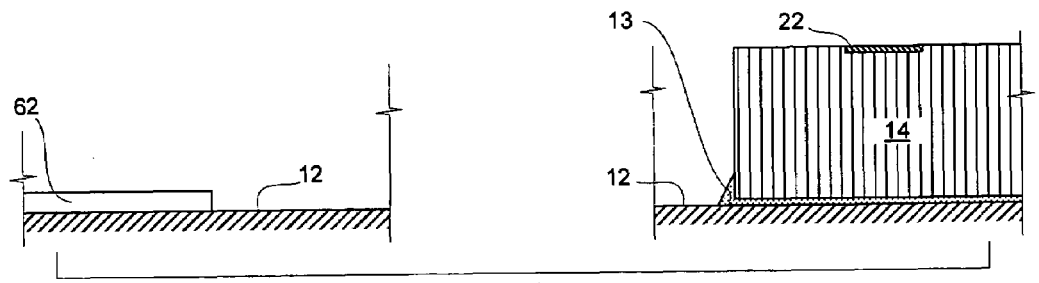
FIGS. 11A-11D are diagrammatic sketches in a sectional view showing steps in the formation of first (right in the FIGS.) and second (left in the FIGS.) interconnection of a die with a substrate according to an embodiment of the invention.
Figure 11B:
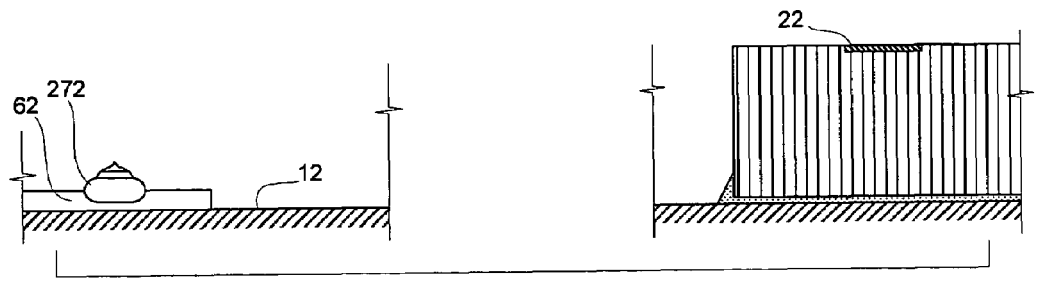
Figure 11C:
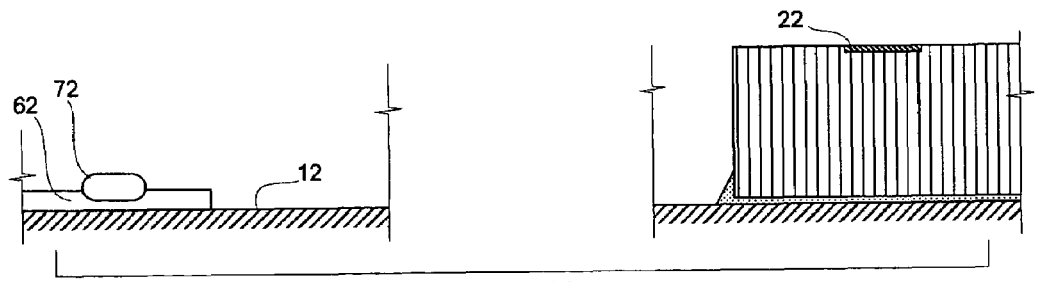
Figure 11D:
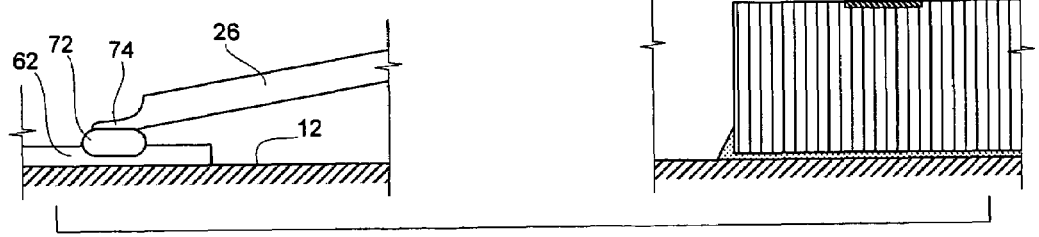

Stages in a generalized process for making a wire bind interconnect according to the inventions are illustrated in FIGS. 11A-11D. FIG. 11A shows a stage in which a die 22 mounted using a die attach adhesive 13 on a die attach side of a substrate 12 is provided. Electrical interconnect pads 22 are situated in the active side of the die. Lead fingers having narrow bond sites 62 are patterned in a metal layer in the substrate. Using wire bond apparatus, a ball 272 is formed by a stud bumping procedure on the bond site of the lead finger 62, as shown in FIG. 11B. The ball is then flattened, for example by coining, to form a support pedestal 72 at the bond site on the lead finger as shown in FIG. 11C. Then a ball bond 24 is formed on the die pad 22, the wire 26 is drawn to the bond site on the lead finger 62, and a stitch bond 74 is formed on the support pedestal 72. Other steps will be interposed or added, including steps well known in the art. For example, following wire bonding of all the appropriate die pads with all the corresponding lead fingers, the die and wires are molded or encapsulated.

Other embodiments are within the following claims.

We claim:

1. A wire bond interconnection between a die pad and a lead finger, comprising a support pedestal at a bond site of the lead finger between the wire and the lead finger, the support pedestal being formed around a top and sides of the lead finger and being in direct contact with the lead finger, a ball bond on the die pad, and a stitch bond having the wire being metallurgically bonded directly to the support pedestal.

2. The wire bond interconnection of claim 1 wherein the lead finger at the bond site is narrower than a diameter of the support pedestal.

3. The wire bond interconnection of claim 1 wherein the lead finger at the bond site comprises a plateau which is narrower than a diameter of the support pedestal.

4. The wire bond interconnection of claim 3 wherein the plateau is generally flat.

5. The wire bond interconnection of claim 3 wherein the plateau is rounded.

6. The wire bond interconnection of claim 1 wherein the lead finger at the bond site comprises an apex.

7. The wire bond interconnection of claim 6 wherein the apex is rounded.

8. The wire bond interconnection of claim 1, wherein a cross section of the lead finger at the bond site may have a generally trapezoidal appearance, with slanted sides between a base and a plateau.

9. The wire bond interconnection of claim 8 wherein the plateau is generally flat.

10. The wire bond interconnection of claim 8 wherein the plateau is rounded.

11. The wire bond interconnection of claim 1 wherein a cross section of the lead finger at the bond site may have a generally triangular appearance truncated at an apex, having slanted sides between the base and the truncation.

12. The wire bond interconnection of claim 11 wherein the truncation is generally flat.

13. The wire bond interconnection of claim 11 wherein the truncation is rounded.

14. The wire bond interconnection of claim 1 wherein a cross section of the lead finger at the bond site may have a generally triangular appearance, having slanted sides meeting at an apex.

15. The wire bond interconnection of claim 14 wherein the apex is rounded.

16. The wire bond interconnection of claim 1 wherein the lead finger at the bond site is relatively wider than high.

17. The wire bond interconnect of claim 1 wherein the lead finger at the bond site is relatively narrower than high.

18. The wire bond interconnection of claim 1 wherein the lead finger at the bond site comprises a plateau which has a width less than about 40 µm.

19. The wire bond interconnection of claim 1 wherein the lead finger at the bond site has a base and slanted sides converging toward a plateau or apex, and wherein the support pedestal conforms to at least an upper part of at least one of the slanted sides.

20. The wire bond interconnection of claim 19 wherein the support pedestal conforms to the full height of at least one of the slanted sides, so that a part of the pedestal contacts a substrate dielectric alongside the lead finger.

21. The wire bond interconnection of claim 1 wherein the lead finger is plated.

22. The wire bond interconnection of claim 1 wherein the lead finger is unplated.

* * * * *